United States Patent
Moon et al.

(10) Patent No.: US 11,716,905 B2
(45) Date of Patent: Aug. 1, 2023

(54) LIQUID-BASED THERMOELECTRIC DEVICE

(71) Applicant: Board of Regents, The University of Texas System, Austin, TX (US)

(72) Inventors: Hyejin Moon, Euless, TX (US); Ali Farzbod, Dallas, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 37 days.

(21) Appl. No.: 16/449,838

(22) Filed: Jun. 24, 2019

(65) Prior Publication Data
US 2019/0393394 A1    Dec. 26, 2019

Related U.S. Application Data

(60) Provisional application No. 62/688,949, filed on Jun. 22, 2018.

(51) Int. Cl.
| | |
|---|---|
| *H10N 10/857* | (2023.01) |
| *H10N 10/00* | (2023.01) |
| *H10N 10/85* | (2023.01) |
| *H10N 15/00* | (2023.01) |
| *H10N 10/851* | (2023.01) |

(Continued)

(52) U.S. Cl.
CPC ........ *H10N 10/857* (2023.02); *B01J 31/0277* (2013.01); *B01J 31/0298* (2013.01); *B01J 2219/00047* (2013.01); *H01G 9/2013* (2013.01); *H10N 10/00* (2023.02); *H10N 10/85* (2023.02); *H10N 10/851* (2023.02); *H10N 15/00* (2023.02); *H10N 15/10* (2023.02)

(58) Field of Classification Search
CPC ......... H01L 35/26; H01L 35/28; H01L 37/00; H01L 35/24; H10N 10/857; H10N 10/00; H10N 10/85; H10N 10/851; H10N 15/00; H10N 15/10; B01J 31/0277; B01J 31/0298; B01J 2219/00047
See application file for complete search history.

(56) References Cited

U.S. PATENT DOCUMENTS

| | | | | |
|---|---|---|---|---|
| 2010/0212711 | A1* | 8/2010 | Liu | H01L 35/30 136/205 |
| 2013/0276851 | A1* | 10/2013 | Crispin | H01L 35/28 136/201 |

(Continued)

OTHER PUBLICATIONS

H. Keppner "Ionic Liquid-based Thermoelectric Generator: Links between Liquid Data and Generator Characteristics" Materials Today: Proceedings 2 ( 2015 ) 680-689 (Year: 2015).*

(Continued)

*Primary Examiner* — Michael Y Sun
(74) *Attorney, Agent, or Firm* — Maynard Nexsen PC; John P. Zimmer (57) ABSTRACT

An electrochemical cell comprises a first electrode having a first inner surface; a second electrode having a second inner surface, the second inner surface facing the first inner surface; a nanostructured material positioned on at least one of the first inner surface and second inner surface; and an ionic liquid positioned between the first inner surface and the second inner surface, the ionic liquid being in electrical communication with the first electrode and second electrode.

20 Claims, 8 Drawing Sheets

(51) Int. Cl.
    *H10N 15/10*    (2023.01)
    *B01J 31/02*    (2006.01)
    *H01G 9/20*     (2006.01)

(56) References Cited

U.S. PATENT DOCUMENTS

| | | | | |
|---|---|---|---|---|
| 2014/0230871 A1* | 8/2014 | Nishio | .................... | H01L 35/08 |
| | | | | 136/205 |
| 2015/0282273 A1* | 10/2015 | Ingle | .................... | H01L 51/56 |
| | | | | 315/309 |
| 2017/0278643 A1* | 9/2017 | El-Kady | ................ | H01G 11/04 |
| 2017/0373240 A1* | 12/2017 | Kato | ........................ | H01L 35/26 |
| 2020/0144471 A1* | 5/2020 | Kato | ........................ | H01L 35/32 |

OTHER PUBLICATIONS

D. Zhao "Ionic thermoelectric supercapacitors" Energy Environ. Sci., 2016, 9, 1450 (Year: 2016).*

Andreas Hartel "Heat-to-current conversion of low-grade heat from a thermocapacitive cycle by supercapacitors" Energy Environ. Sci., 2015, 8, 2396 (Year: 2015).*

Hongyao Zhou "Supramolecular Thermo-Electrochemical Cells: Enhanced Thermoelectric Performance by Host-Guest Complexation and Salt-Induced Crystallization" (Year: 2016).*

Wen Qi "Flexible electrodes of MnO2/CNTs composite for enhanced performance on supercapacitors" Surface & Coatings Technology 320 (2017) 624-629 (Year: 2017).*

Stefanie Uhl "Fabrication of highly-integrated thermoelectric generators based on Ionic Liquids" Materials Today: Proceedings 2 ( 2015 ) 669-674 (Year: 2015).*

Guangyu Chai "Characterization Study of the Thermal Conductivity of Carbon Nanotube Copper Nanocomposites" Journal of Composite Materials, vol. 44, No. 24/2010 (Year: 2010).*

T. J. Abraham, D. R. Macfarlane, R. H. Baughman, L. Jin, N. Li, and J. M. Pringle, "Towards ionic liquid-based thermoelectrochemical cells for the harvesting of thermal energy," Electrochim. Acta, vol. 113, pp. 87-93, 2013.

R. Koerver, D. R. MacFarlane, and J. M. Pringle, "Evaluation of Electrochemical Methods for Determination of the Seebeck Coefficient of Redox Electrolytes," Electrochim. Acta, vol. 184, pp. 186-192, 2015.

T. J. Abraham, D. R. MacFarlane, and J. M. Pringle, "High Seebeck coefficient redox ionic liquid electrolytes for thermal energy harvesting," Energy Environ. Sci., vol. 6, No. 9, pp. 2639-2645, 2013.

D. Zhao, H. Wang, Z. U. Khan, J. C. Chen, R. Gabrielsson, M. P. Jonsson, M. Berggren, and X. Crispin, "Ionic thermoelectric supercapacitors," Energy Environ. Sci. Energy Environ. Sci, vol. 9, No. 9, pp. 1450-1457, 2016.

W. Lu, L. Qu, K. Henry, and L. Dai, "High performance electrochemical capacitors from aligned carbon nanotube electrodes and ionic liquid electrolytes," J. Power Sources, vol. 189, No. 2, pp. 1270-1277, 2009.

S. Santhanagopalan, A. Balram, and D. D. Meng, "Scalable high-power redox capacitors with aligned nanoforests of crystalline MnO2 nanorods by high voltage electrophoretic deposition," ACS Nano, vol. 7, No. 3, pp. 2114-2125, 2013.

* cited by examiner

LIQUID-BASED THERMOELECTRIC DEVICE

CROSS-REFERENCE TO RELATED APPLICATIONS

This application claims priority pursuant to 35 U.S.C. § 119 to U.S. Provisional Patent Application No. 62/688,949, filed on Jun. 22, 2018, the entirety of which is incorporated by reference herein.

FIELD

The invention is generally related to electrochemical cells and thermoelectric devices, and, more specifically, to electrochemical cells and thermoelectric devices using an ionic liquid as a thermoelectric material.

BACKGROUND

Thermoelectricity is the conversion between heat and electricity. All materials can exhibit thermoelectric effects, but the term "thermoelectric" typically describes materials that show a strong thermoelectric effect and have a high Seebeck coefficient.

Thermoelectric materials generate electricity when subjected to a temperature gradient. The rate at which energy is conducted as heat between two bodies is a function of the temperature difference (temperature gradient) between the two bodies and the properties of the conductive medium through which the heat is transferred. Thermoelectric materials are used in niche cooling applications, for example, to maintain very stable temperatures in lasers and optical detectors, and they are often found in office water coolers. They are also used in space exploration to convert heat from a radioactive material into electricity. The most common thermoelectric modules currently in use consist of conventional thermoelectric materials in solid phase such as p- and n-type semiconductor legs.

Conventional thermoelectric materials are known to have charge carriers of electrons or holes, which are used to transfer electricity. Conventional thermoelectric devices use thermoelectric materials in solid phase. Typically this solid phase is made from a semiconductor material, which is considered to be the most suitable for thermoelectric applications. Current studies, publications and prospective devices using solid phase thermoelectric materials such as metals, insulators, semiconductors and a combination thereof all aim to improve the figure of merit (ZT), which is an indicator of thermoelectric performance.

Efforts to increase the figure of merit (ZT) value of thermoelectric devices and materials has resulted in an increase of attainable ZT values, with semiconductors having a ZT around 1 at room temperature and around 2.5 at higher temperatures. However, while ZT has been improved, efficiency of the solid phase materials themselves, such as the semiconductors, has only minimally contributed to the improved ZT, and has not made the production of thermoelectric devices any easier or cheaper. For example, the highest performance thermoelectric materials developed to date are trace elements, such as tellurium. High performance alternatives to these expensive and rare materials has generated significant interest in designing and improving thermoelectric devices using cheaper traditional solid state materials, such as metal oxides and silicides.

However, attempts to improve the thermoelectric properties of traditional solid-state materials has proven to be quite challenging, and the current state of these technologies is plagued with bulky batteries, expensive materials, and little to no significant improvement to ZT. Therefore, there exists a need for improved electrochemical cells having desirable ZT values, that use commonly available materials, that are inexpensive to manufacture, and have small form factors.

SUMMARY

In an aspect, an electrochemical cell comprises a first electrode having a first inner surface; a second electrode having a second inner surface, the second inner surface facing the first inner surface; a nanostructured material positioned on at least one of the first inner surface and second inner surface; and an ionic liquid positioned between the first inner surface and the second inner surface, the ionic liquid being in electrical communication with the first electrode and second electrode.

In some embodiments, the nanostructured material is a first nanostructured material positioned on the first inner surface. In some embodiments, the nanostructured material is a second nanostructured material positioned on the second inner surface.

In some cases, the nanostructured material comprises a first nanostructured material positioned on the first inner surface; and a second nanostructured material positioned on the second inner surface. The first nanostructured material and the second nanostructured material can comprise the same nanostructured material in some instances, and in other instances, the first nanostructured material is a different nanostructured material than the second nanostructured material.

The first electrode and second electrode comprise electrically conductive plates made of any electrically conductive material not inconsistent with the objectives of this disclosure.

In some embodiments, a nanostructured material described herein has an average size in one dimension of between about 8 nm and about 12 µm. In some cases, the nanostructured material comprises carbon nanotubes (CNT) having an average size in one dimension of between about 10 nm and about 10 µm. In other cases, a nanostructured material described herein comprises $MnO_2$ having an average size in one dimension of between about 10 nm and about 10 µm. In some instances, a nanostructured material described herein comprises $CNT-MnO_2$ having an average size in one dimension of between about 10 nm and about 10 µm.

The ionic liquid can be an imidazolium-based ionic liquid in some embodiments. In some preferred embodiments, the imidazolium-based ionic liquid comprises ethyl-3 methylimidazolium triflate, ethyl-3 methylimidazolium tetrafluroborate, ethyl-3 methylimidazolium bis(trifluoromethylsulfonyl)imide, or any combination thereof.

In some embodiments, the ionic liquid further comprises a nanoparticle dispersion. The nanoparticles in the nanoparticle dispersion can comprise a multi-wall carbon nanotube, a semiconductor, a metal, a synthetic polymer, or any combination thereof.

In some embodiments, an electrochemical cell described herein has a figure of merit (ZT) of at least 2 at all operating temperatures.

In some cases, nanoparticles in a nanoparticle dispersion described herein increases electrical conductivity ($\sigma$) of the ionic liquid, and increases a figure of merit (ZT) value of the electrochemical cell compared to an electrochemical cell without a nanoparticle dispersion.

In some embodiments, a thermo-electrochemical cell comprises an electrochemical cell of described herein. In other embodiments, a thermocapacitive cell comprises an electrochemical cell described herein. In yet other embodiments, a thermoelectric device comprises an electrochemical cell described herein.

DETAILED DESCRIPTION

Embodiments described herein can be understood more readily by reference to the following detailed description, examples, and drawings. Elements, apparatus and methods described herein, however, are not limited to the specific embodiments presented in the detailed description, examples, and drawings. It should be recognized that these embodiments are merely illustrative of the principles of the present disclosure. Numerous modifications and adaptations will be readily apparent to those of skill in the art without departing from the spirit and scope of the disclosure.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

All ranges disclosed herein are also to be considered to include the end points of the range, unless expressly stated otherwise. For example, a range of "between 5 and 10" or "from 5 to 10" or "5-10" should generally be considered to include the end points 5 and 10.

Further, when the phrase "up to" is used in connection with an amount or quantity, it is to be understood that the amount is at least a detectable amount or quantity. For example, a material present in an amount "up to" a specified amount can be present from a detectable amount and up to and including the specified amount.

In one aspect, an electrochemical cell is described herein. In some embodiments, an electrochemical cell comprises a first electrode and a second electrode. The first electrode has a first inner surface and a first outer surface, and the second electrode has a second inner surface and a second outer surface. The second inner surface faces the first inner surface, such that the first and second inner surfaces are opposing each other. A nanostructured material is positioned on at least one of the first inner surface and second inner surface. An ionic liquid is positioned or disposed between the first inner surface and the second inner surface, where the ionic liquid being in electrical communication with the first electrode and second electrode. As described in more detail herein, when in use, the ionic liquid is in contact with the nanostructured material.

The first electrode and the second electrode can comprise electrically conductive plates, or any other electrode form or shape known to the skilled artisan. The first electrode and the second electrode can be made from any electrode material not inconsistent with the objectives of this disclosure. Exemplary electrode materials include copper and copper alloys with graphite, zinc (to form brass), tin (to form bronze), aluminum, manganese, nickel, arsenic, phosphorus, silicon, tellurium, and/or tungsten; silver; titanium; steel, platinum and platinum alloys with copper, iridium, ruthenium, and/or tungsten; gold; graphite and carbon; mixed metal oxide having a carbon core or inert metal core such as iron, titanium, zirconium, niobium, or tantalum, and an oxide coating over the core such as ruthenium oxide, iridium oxide, platinum oxide, titanium oxide, and the like. The first and second electrodes can be made from the same or different electrode materials.

The first electrode and the second electrode can be spaced apart at any distance not inconsistent with the objectives of this disclosure. In some embodiments, the first electrode and the second electrode can be positioned apart at a distance of 100 µm to 20 cm, 200 µm to 20 cm, 300 µm to 20 cm, 400 µm to 20 cm, 500 µm to 20 cm, 600 µm to 20 cm, 700 µm to 20 cm, 800 µm to 20 cm, 900 µm to 20 cm, 1 cm to 20 cm, 5 cm to 20 cm, 10 cm to 20 cm, 100 pin to 10 cm, 100 µm to 5 cm, 100 µm to 1 cm, 100 µm to 900 µm, 100 µm to 800 min, 100 µm to 700 µm, 100 µm to 600 µm, 100 µm to 500 µm, 100 µm to 400 µm, 100 µm to 300 µm, 100 µm to 200 µm, 100 µm, 200 µm, 300 µm, 400 µm, 500 µm, 600 µm, 700 µm, 800 µm, 900 µm, 1 cm, 5 cm, 10 cm, 15 cm, or 20 cm.

In some embodiments when the electrochemical cell is part of and/or comprises a thermoelectric device, one of the first electrode and the second electrode can be positioned adjacent to a hot junction, and the other of the first electrode and the second electrode can be positioned adjacent to a cold junction. For purposes of simplicity, the first electrode will be discussed herein as being positioned adjacent to a hot junction, and the second electrode will be discussed as being positioned adjacent to a cold junction. However, the skilled artisan will appreciate that this designation is arbitrary and not limiting, and that in other embodiments, the first electrode will can be positioned adjacent to a cold junction, and the second electrode can be positioned adjacent to a hot junction.

Figure 1A:
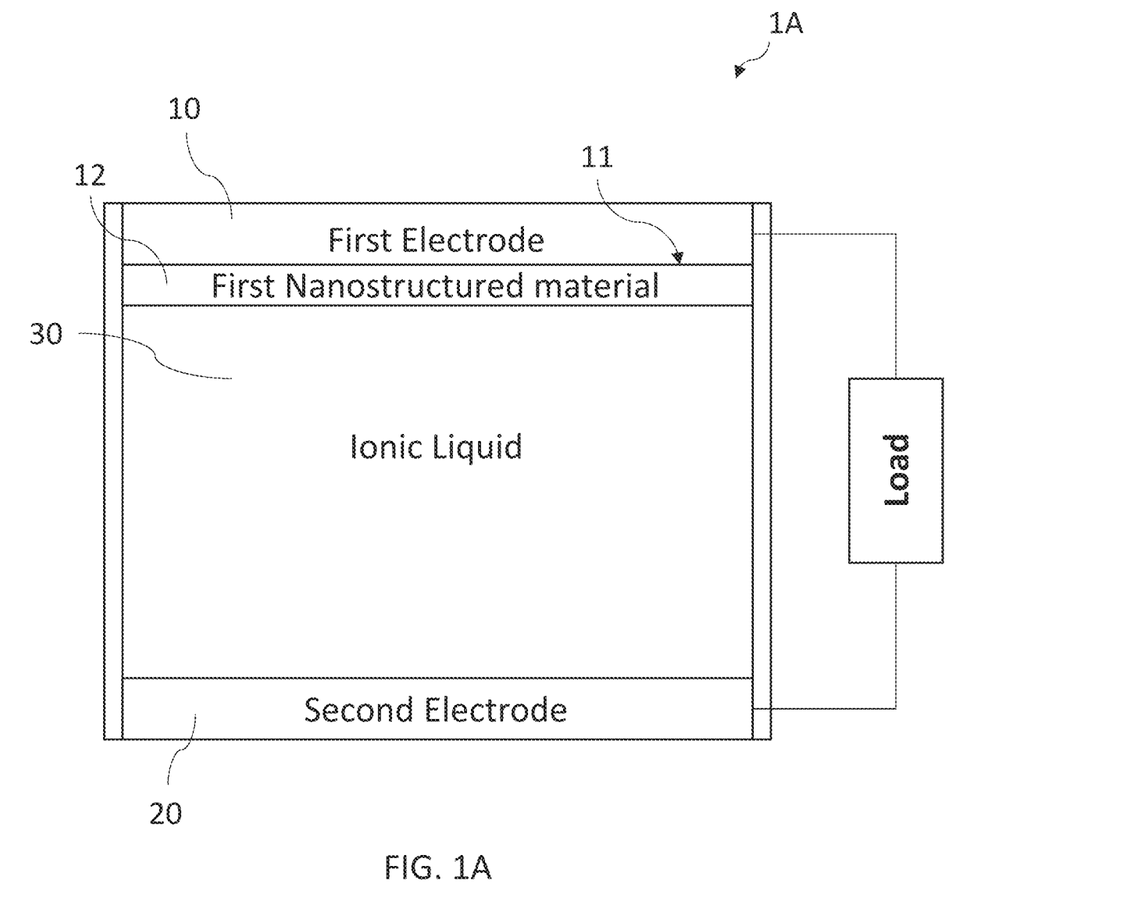
FIG. 1A is a schematic drawing of a thermoelectric device having an electrochemical cell with a first nanostructured material positioned on an inner surface of a first electrode.
Figure 1B:
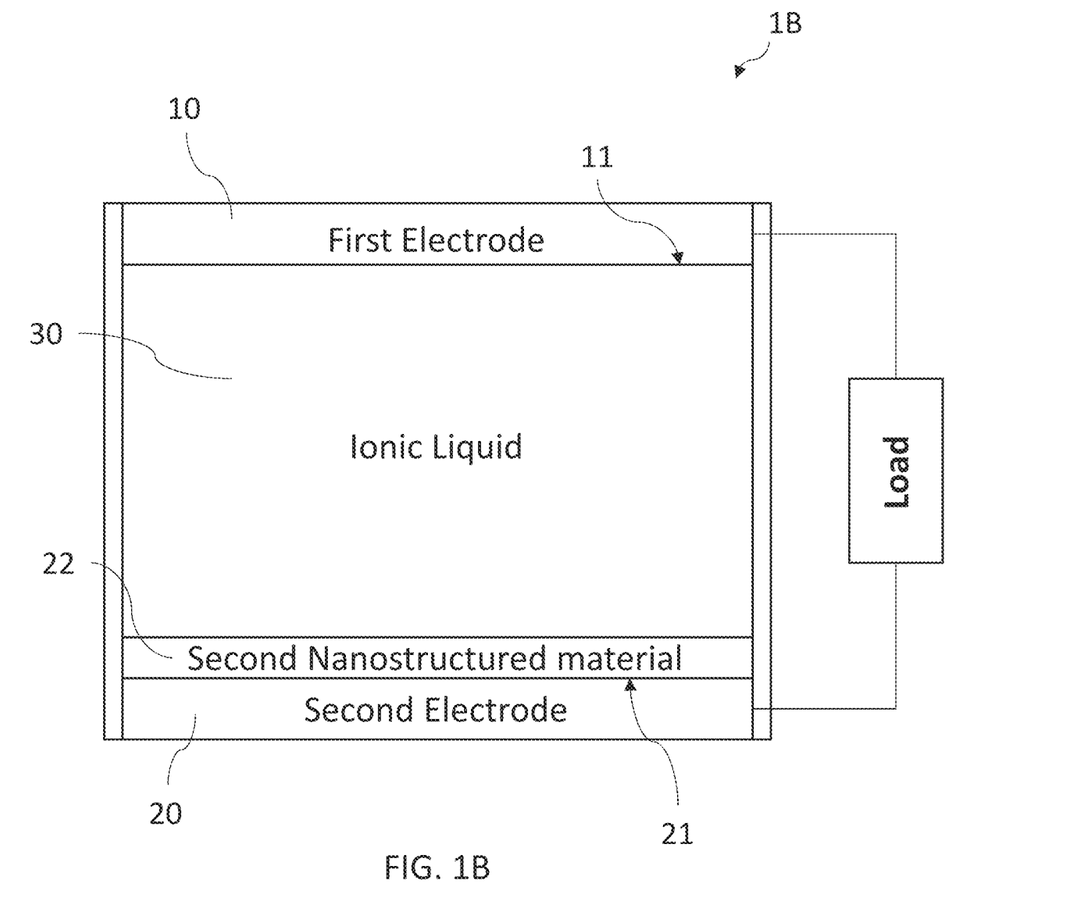
FIG. 1B is a schematic drawing of a thermoelectric device having an electrochemical cell with a second nanostructured material positioned on an inner surface of a second electrode.
Figure 1C:
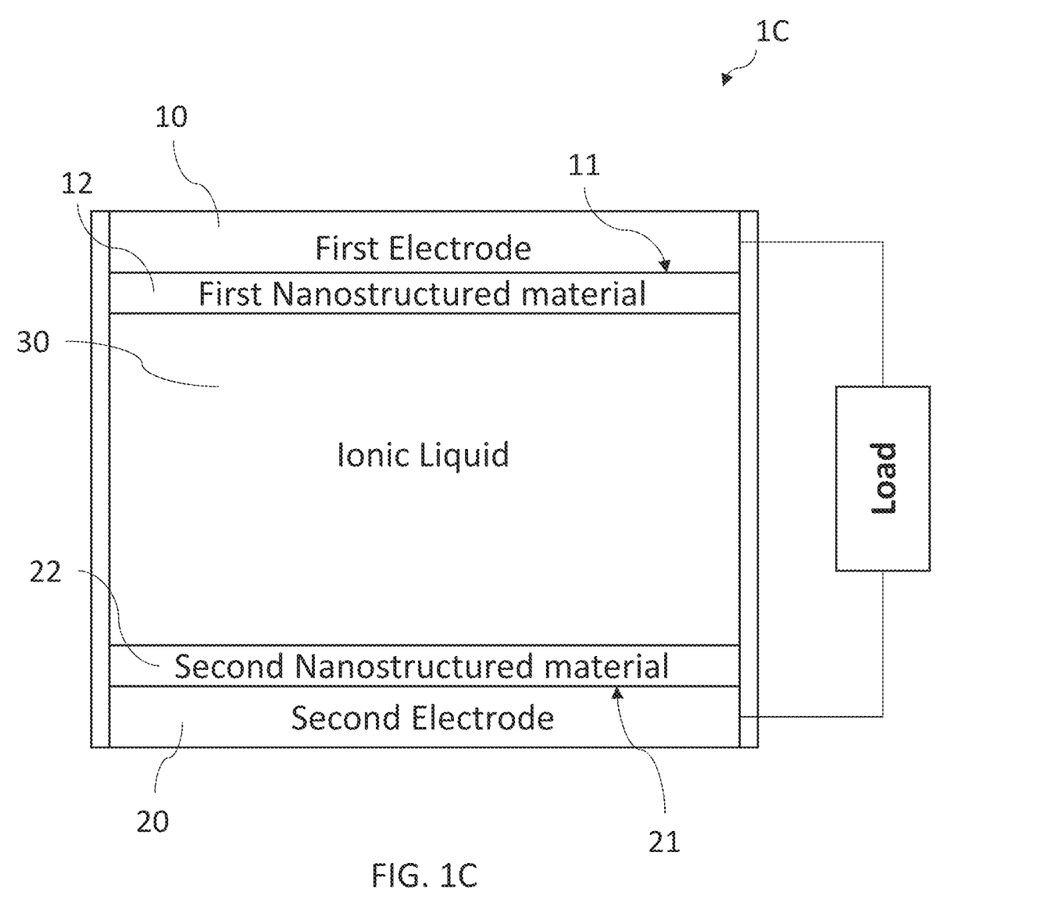
FIG. 1C is a schematic drawing of a thermoelectric device having an electrochemical cell with a first nanostructured material positioned on an inner surface of a first electrode, and a second nanostructured material positioned on an inner surface of a second electrode.

In some embodiments, a nanostructured material described herein is a first nanostructured material positioned on the first inner surface of the first electrode. FIG. 1A discloses an embodiment of an electrochemical cell 1A having a first electrode 10 with a first inner surface 11 coated with a first nanostructured material 12. In other instances, a nanostructured material described herein is a second nanostructured material positioned on the second inner surface of the second electrode. FIG. 1B discloses an embodiment of an electrochemical cell 1B having a second electrode 20 with a second inner surface 21 coated with a second nanostructured material 22. In some cases, a first nanostructured material is positioned on the first inner surface of the first electrode; and a second nanostructured material is positioned on the second inner surface of the second electrode. FIG. 1C discloses an embodiment of an electrochemical cell IC having a first electrode 10 with a first inner surface 11 coated with a first nanostructured material 12; and a second electrode 20 with a second inner 21 surface coated with a second nanostructured material 22.

The first nanostructured material and the second nanostructured material can be made of or comprised of the same nanostructured material in some cases. In other cases, the first nanostructured material can be made of or comprised of a different nanostructured material than the second nanostructured material.

Exemplary nanostructured materials comprise carbon nanotubes (CNT); carbon nanoparticles, including fullerenes; metal oxides of transition metals, such as ruthenium ($RuO_2$), iridium ($IrO_2$), iron ($Fe_3O_4$), and manganese ($MnO_2$); sulfides such as titanium sulfide ($TiS_2$); conductive polymers such as polyaniline, polythiophene, polypyrrole, and polyacetylene or their combinations; metal nanowires; silicon nanowires; silicon nanowires/metal composites; or combinations thereof, such as CNT–$MnO_2$. In some instances, the carbon nanotubes are aligned on the surface of the first electrode and/or second electrode.

The nanostructured materials can have a size in one dimension of 1 nm to 100 μm, 10 nm to 100 μm, 40 nm to 100 μm, 80 nm to 100 μm 100 nm to 100 μm, 200 nm to 100 μm, 300 nm to 100 μm, 400 nm to 100 μm, 500 μm to 100 μm, 600 nm to 100 μm, 700 nm to 100 μm, 800 nm to 100 μm, 1 μm to 100 μm, 8 nm to 12 μm, 10 nm to 10 μm, 1 nm to 1 μm, 1 nm to 900 nm, 1 nm to 800 nm, 1 nm to 700 nm, 1 nm to 600 nm, 1 nm to 500 nm, 1 nm to 400 nm, 1 nm to 300 nm, 1 nm to 200 nm, 1 nm to 100 nm, 50 nm to 1 μm, 100 nm to 900 nm, 200 nm to 800 nm, 300 nm to 700 nm, 400 to 600 nm, 1 nm to 500 nm, 50 nm to 450 nm, 100 nm to 350 nm, 150 nm to 250 nm, 300 nm to 900 nm, 400 nm to 800 nm, or 500 nm to 700 nm. In a preferred embodiment, a nanostructured materials have structural elements in the 8 nm to 12 μm range. In some embodiments, the nanostructured material comprises carbon nanotubes (CNT) having an average size in one dimension of between about 10 nm and about 10 μm. In some cases, the nanostructured material comprises $MnO_2$ having an average size in one dimension of between about 10 nm and about 10 μm. In some cases, the nanostructured material comprises CNT–$MnO_2$ having an average size in one dimension of between about 10 nm and about 10 μm.

Nanostructured materials described herein can form layers on a surface of an electrode. The thickness of the nanostructured material is generally dependent upon the particular type of nanostructured material (e.g., ACNT vs $MnO_2$), an can have any thickness not inconsistence with the objectives of this disclosure. The thickness in some cases has a value that balances a thickness that can be reliably and evenly coated with a thickness that, as the value increases, unfavorably increases electrical resistance of the nanostructured material. In some embodiments, the nanostructured material layer can have a thickness of less than 1 nm, 1 nm to 100 μm, 10 nm to 100 μm, 40 nm to 100 μm, 80 nm to 100 μm, 100 nm to 100 μm, 200 nm to 100 μm, 300 nm to 100 μm, 400 nm to 100 μm, 500 nm to 100 μm, 600 nm to 100 μm, 700 nm, to 100 μm, 800 nm to 100 μm, 1 μm to 100 μm, 8 nm to 12 μm, 10 nm to 10 μm, 1 nm to 1 μm, 1 nm to 900 nm, 1 nm to 800 nm, 1 μm to 700 nm, 1 nm to 600 nm, 1 nm to 500 nm, 1 nm to 400 nm, 1 nm to 300 nm, 1 nm to 200 nm, 1 nm to 100 nm, 50 nm to 1 μm, 100 nm to 900 nm, 200 nm to 800 nm, 300 nm to 700 nm, 400 to 600 nm, 1 nm to 500 nm, 50 nm to 450 nm, 100 nm to 350 nm, 150 nm to 250 nm, 300 nm to 900 nm, 400 nm to 800 nm, or 500 nm to 700 nm.

An ionic liquid described herein can be any ionic liquid not inconsistent with the objectives of this disclosure. Generally, an ionic liquid is a salt that is in a liquid state. Often ionic liquids are a combination of an organic cation and a variety of organic and inorganic anions. In some embodiments, ionic liquids described herein have an organic cation that is imidazolium-based, pyridinium-based, pyrrolidinium-based, phosphonium-based, ammonium based, sulfonium-based, or any combination thereof. Ionic liquids described herein can have an anion that is an alkylsulfate, tosylate, methanesulfonate, trifluoromethanesulfonate (triflate), bis(trifluoromethylsulfonyl)imide, tetrafluoroborate, a halide, or an combination thereof.

In some preferred embodiments, the ionic liquid is an imidazolium-based ionic liquid. For example, in some cases, the imidazolium-based ionic liquid comprises ethyl-3 methylimidazolium triflate, ethyl-3 methylimidazolium tetrafluroborate, ethyl-3 methylimidazolium bis(trifluoromethylsulfonyl)imide, or any combination thereof.

In some embodiment, the ionic liquid further comprises a nanoparticle dispersion. Nanoparticles can comprise multi-wall carbon nanotubes, carbon-based nanoparticles, metal nanoparticles, metal oxide nanoparticles, or any combination thereof. Exemplary carbon-based nanoparticles include graphite nanoparticles, pristine graphene, small graphene oxide, large graphene oxide, reduced graphene oxide and the like. Exemplary metal nanoparticles include gold nanoparticles, silver nanoparticles, copper nanoparticles, iron nanoparticles, aluminum nanoparticles, and the like. Exemplary metal oxide nanoparticles include aluminum oxide, copper oxide, iron oxide, and the like In some cases, the nanoparticles in the nanoparticle dispersion increase the electrical conductivity ($\sigma$) of the ionic liquid.

The nanoparticles can be present in the ionic liquid in amounts between 1 wt. % to 45 wt. %, 3 wt. % to 45 wt. %, 5 wt. % to 45 wt. %, 10 wt. % to 45 wt. %, 15 wt. % to 45 wt. %, 20 wt. % to 45 wt. %, 25 wt. % to 45 wt. %, 30 wt. % to 45 wt. %, 35 wt. % to 45 wt. %, up to 5 wt. %, up to 10 wt. %, up to 15 wt. %, up to 20 wt. %, up to 25 wt. %, up to 30 wt. %, up to 35 wt. %, up to 40 wt. %, or up to 45 wt. %.

Nanoparticles described herein can have any average size distribution not inconsistent with the objectives of this disclosure. In some embodiment, the nanoparticles have an average size distribution of up to 100 nm, up to 200 nm, up to 300 nm, up to 400 nm, up to 500 nm, up to 600 nm, up to 700 nm, up to 800 nm, up to 900 nm, up to 1 μm, up to 5 μm, up to 10 μm, up to 15 μm, up to 20 μm, up to 25 μm, up to 30 μm, up to 35 μm, up to 40 μm, or up to 50 μm.

In some embodiments, the ionic liquid can further comprise various additives, such as additives that increase the conductivity of ionic liquids. In some cases, the additive can comprise acetonitrile present in the ionic liquid in a concentration of 1-30%, 5-25%6, 10-20%, 12-18% 1-25%, 1-20%, 1-15%, 1-10%, 1-5%, 5-30%, 10-30%, 15-30%, 20-30%, 25-30%, 1%, 3%, 5%, 7%, 9%, 10%, 12%, 14%, 16%, 18%, 20% 22%, 25%, 27%, or 30%.

As is known in the art, a thermoelectric efficiency of a material is quantified by a figure of merit (ZT), which is a measure of a thermoelectric performance of a device or material The ZT contains three physical quantities; the Seebeck coefficient (S or α), the electrical conductivity (σ) and the thermal conductivity (κ), which is represented by Equation 1:

$$ZT = \frac{\alpha^2 \sigma T}{\kappa}. \qquad \text{Eq. 1}$$

The Seebeck coefficient (S or α) is the voltage generated per degree of temperature difference over a material. The electrical conductivity (σ) is the measure of the material's ability to conduct electric current, and the thermal conductivity (κ) is the ability of the material to transfer heat under the effect of a temperature gradient across its points. Therefore κ is a measure of how well heat is conducted.

The choice of a thermoelectric material depends on its figure of merit (ZT), which depends on the Seebeck coefficient (S or α) and the conductivity. Contrary to metals and insulators, semiconductors have high figure of merit (ZT), because they have high electrical conductivity (σ) and relatively high Seebeck coefficient (S or α). This typically makes semiconductors the most suitable for thermoelectric applications. However, as previously discussed, with semiconductors have been developed have a ZT of 1.5 at room temperature and 2 at higher temperatures, these desirable characteristics are only obtainable using rare and expensive semiconductor materials, making their commercial applications very limited. Additionally, the quantity of material required to make devices using these semiconductor materials is rather large, resulting in relatively bulky, large, and heavy devices that are undesirable in applications where smaller sized form factors are required.

Electrochemical cells described herein can provide a more efficient thermoelectric device using an ionic liquid as a thermoelectric material and improve the figure of merit (ZT) at all temperatures, resulting in a lighter device compared to known semiconductor-based thermoelectric devices. In some embodiments, electrochemical cells comprise a nanoparticle dispersion in the ionic liquid, where the presence of the nanoparticle distribution increases a figure of merit (ZT) value of the electrochemical cell compared to an electrochemical cell without a nanoparticle dispersion.

In some embodiments, an electrochemical cell described herein has a figure of merit (ZT) of at least 2 at all operating temperatures. In other instances, the electrochemical cell has a ZT of at least 2.2, and least 2.4, at least 2.6, at least 2.8, at least 3, at least 3.2, at least 3.4, or at least 3.5 at all operating temperatures.

In an example embodiment, thermoelectric devices that comprise electrochemical cells having an ionic liquid as a thermoelectric material can be used for harvesting waste energy and converting waste heat into electricity via charge storing or current extraction at the inner surface of the electrodes and an ionic liquid. As previously described, a ionic liquid is dispensed between the inner surfaces of the first electrode and the second electrode, and is in electrical communication with the first electrode and the second electrode. Such electrical communication is believed to be created and transferred through the mobility of ions in the ionic liquid, and enhanced by an increase in surface area of the inner surfaces of the electrodes by the nanostructured material layer. In certain embodiments, nanoparticles can be mixed with ionic liquid for enhancing diffusion and electrical conductivity (σ).

Figure 2:
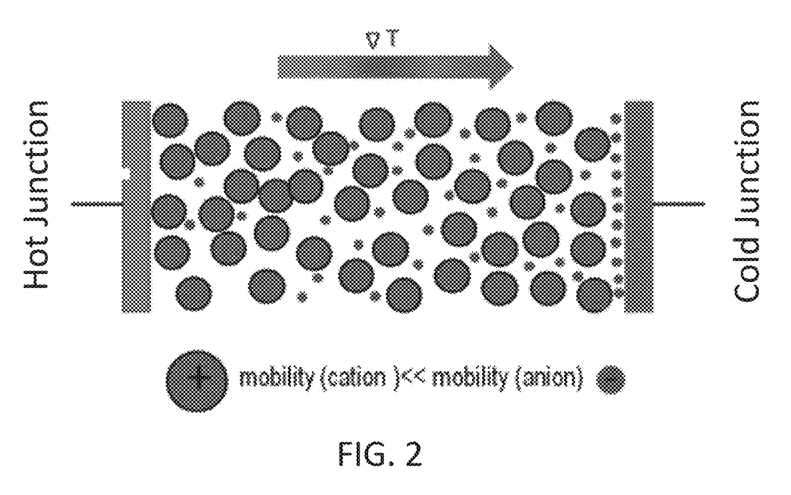
FIG. 2 is an illustration of the mobility of ions in ionic liquid from one electrode to the other electrode that can increase a Seebeck coefficient (S or $\alpha$) in an electrochemical cell.

As previously discussed, FIG. 2 illustrates a possible cause of high Seebeck coefficient (S or α) in the electrochemical cells, which is believed to be based on a mobility of ions in ionic liquid from one electrode to the other electrode in accordance with aspects of the present invention, and, in some cases, from the formation of a double layer ("DL") on the inner surfaces of the electrodes.

Conventional solid thermoelectric materials transfer electricity through electrons. When the temperature rises, the electrons transfer rate remains in the same range as when at room temperature and as a result, the transfer rate does not increase exponentially. In contrast, in some electrochemical cells described herein, electricity flows through ion movement (rather than electron), and ions can have a lot more resistance than electrons. The lower the temperature, the higher the viscosity of the ionic liquid, therefore the lower the mobility of ions. However, when the temperature increases, the viscosity of the ionic liquid decreases and ion mobility and energy increases, resulting in quantum jumps in electric conductivity exponential increases in energy levels.

In some embodiments, the efficiency of electrochemical cells described herein is related to the figure of merit (ZT), with the higher the figure of merit (ZT), the higher the efficiency of the electrochemical cell. Electrical conductivity (σ) is related to the mobility of ions and the contact resistance between the inner surface of electrodes and the ionic liquid. In some embodiments, contact resistance between the ionic liquid and electrodes is decreased by depositing nanostructured materials at the inner surface of the first electrode and/or the second electrode. In these cases, as the temperature increases, the mobility of the ions increases exponentially, therefore increasing the electrical conductivity (σ) and contributing to a higher figure of merit (ZT). In contrast, no such advantage is seen in conventional semiconductor materials and cells, because electrical conductivity values of electron transfer do not noticeable increase with increasing temperature.

As shown in FIG. 2, the Seebeck coefficient (S or α) measurement includes an ionic liquid in the temperature gradient. The ionic liquid in temperature gradient exhibits a voltage generated across the electrochemical cell due to the difference in mobility of ions in the ionic liquid. The origin of charge carrier separation in the ionic liquid is due to the difference in thermal diffusion coefficients of cations and anions. At constant heat flow and at equilibrium with the electrostatic field, the separation creates a steady state potential between the first electrode and the second electrode.

Room temperature ionic liquids (RTILs) have an at least 3 or even up to at least 30 times greater Seebeck coefficient compared to conventional thermoelectric materials. In some instances, the Seebeck coefficient (S or α) of the ionic liquid in the electrochemical cell is at least 3 times higher, at least 4 times higher, at least 5 times higher, at least 6 times, higher at least 7 times higher, at least 8 times higher, at least 9 times higher, at least 10 times higher, at least 11 times higher, at least 12 times higher, at least 13 times higher, at least 14 times higher, at least 15 times higher, at least 20 times higher, or at least 30 times higher than the Seebeck coefficient (S or α) observed in conventional thermoelectric materials. In one embodiment, the ionic liquid has a Seebeck coefficient of at least 12-20 greater than a that observed in a conventional thermoelectric materials. In some embodiments, the Seebeck coefficient (S or α) of the ionic liquid in the electrochemical cell has a value of between about 1 mV/K and 10 mV/K, 2 mV/K and 10 mV/K, 3 mV/K and 10 mV/K, 4 mV/K and 10 mV/K, 5 mV/K and 10 mV/K, 6 mV/K and 10 mV/K, 7 mV/K and 10 mV/K. 8 mV/K and 10 mV/K, 2 mV/K and 8 mV/K, 3 mV/K and 7 mV/K, 4 mV/K and 6 mV/K, more than 5 mV/K, more than 8 mV/K, more than 10 mV/K, more than 15 mV/K, or above 20 mV/K compared to the maximum value of up to 900 μV/K for conventional thermoelectric devices. In a preferred embodiment, the Seebeck coefficient (S or α) of the ionic liquid in the electrochemical cell has a value of more than 10 mV/K.

However, while RTILs have a higher Seebeck coefficient (S or α), traditionally RTILs have typically suffered from electrical conductivity that is much lower than typical thermoelectric materials. In some instances, this electrical conductivity difference can be on an order of about a $10^5$ difference. The reasons of lower electrical conductivity is believed to be related to high contact resistance at the solid/liquid interface of the RTIL and the surface of the electrode, and to low mobility of ions compared to electrons.

In some embodiment, electrochemical cells described herein have an enhanced liquid/solid interface through the use of the nanostructured material layer. In some instances, the solid/liquid contact resistance at the surface of the first electrode and/or second electrode is decreased by at least 50 times, 100 times, 150 times, 200 times, 250 times, 300 times, or 350 times by the presence of the nanostructured material layer as compared to the electrode without the nanostructured material layer. Furthermore, as discussed herein, the addition of the nanoparticle dispersion in the ionic liquid increases the electrical conductivity of the ionic liquid. Consequently, in some cases, the combination of a nanostructured material layer on the first electrode and/or second electrode and the use of a nanoparticle dispersion in an ionic liquid results in electrochemical cells having a higher Seebeck coefficient and higher electrical conductivity than those of conventional thermoelectric materials. Moreover, the resulting electrochemical cells use cheaper materials, and are smaller in size than the equivalent electrochemical cells using convention thermoelectric materials.

In some embodiments, electrochemical cell described herein can function as a supercapacitor, where the supercapacitor is charged by a temperature difference across the junctions of the cell. In practice, an electrochemical cell have a carbon-based nanostructured material as an active material can have a charge storage mechanism of an electrochemical double layer capacitor. The electrochemical double layer capacitors store energy at the electrolyte/carbon interface through reversible ion adsorption onto the carbon surface, and, as a result, charges the double layer capacitance ($C_{dl}$).

A double layer ("DL" or electrical double layer, "EDL") is a structure that forms on a surface of an object when the surface is exposed to a fluid. In this case, the double layer refers to two parallel layers of charge on the surface of an electrode. A first layer is absorbed or fixed to the surface of the electrode, and has a first charge that can be either positive or negative. In the electrochemical cells described herein, this first layer comprises a nanostructured material. The first layer of nanostructured material can have a surface charge that is either positive or negative. A second layer is formed over the first layer, and comprises ions of an opposite charge to those of the first layer. These second layer ions are attracted to the surface charge by Coulombic force, forming an electrical screening second layer over the first layer. In the electrochemical cells described herein, this second layer can in some cases comprise the ionic liquid and the nanoparticles dissolved therein. The ionic liquid and the nanoparticles are loosely associated with the first layer, and is constantly changing as the free ions in the ionic liquid move through thermal motion and ionic attraction. In some instances this second layer is also known as a "diffuse layer".

FIG. 2 shows an exemplary embodiment of a double layer capacitor comprising a thermoelectric electrochemical cell described herein. An exemplary electrode is shown having a nanostructured material at the cold junction with an overall positive charge. Anions present in the ionic liquid, either from the ionic liquid itself and/or from the nanoparticle dispersion, can form a first layer across the surface of the nanostructured material. Cations present in the ionic liquid can then form a second layer (i.e. an electric screening layer) over the anionic first layer. Conversely, the cations present in the liquid can form a first layer over the hot junction electrode, and the anions can form a second layer (i.e. an electric screening layer) over the cationic first layer. In thermoelectric devices, electrical conduction happens via ion transfer, which is related to mobility of ions in the ionic liquid.

In an example embodiment, aligned carbon nanotubes ("ACNT") can be deposited on the inner surface of the first electrode and/or the second electrode using any known deposition method not inconsistent with the objectives of this disclosure. While not intending to be bound by theory, such deposition is believed to result in more surface to volume ratio at the inner surface of the first electrode and second electrode, causing the first electrode and the second electrode to polarize more charges, resulting in an increase in the double layer capacitance ($C_{dl}$) and higher energy conversion efficiency.

In another example embodiment, manganese dioxide ($MnO_2$) can be deposited at the inner surface of the first electrode and/or the second electrode using any deposition method not inconsistent with the objectives of this disclosure. Again, while not intending to be bound by theory, such deposition is believed to result in more surface charge adsorption at the inner surface of the first electrode and second electrode, causing the first electrode and the second electrode to store more charges resulting in an increased adsorption capacitance (Cads) and higher energy conversion efficiency.

In a further example embodiment, carbon nanotube and/or manganese dioxide ($CNT-MnO_2$) can be deposited at the inner surface of the first electrode and the second electrode using any deposition method not inconsistent with the objectives of this disclosure. This nanostructured layer causes the first electrode and second electrode to polarize and adsorb more charges by increasing the double layer capacitance ($C_{dl}$) and the adsorption capacitance (Cads), and resulting in higher efficiency.

While these embodiments utilize ACNT and/or $MnO_2$, it is contemplated that any nanostructured material that causes the first electrode and the second electrode to polarize more charges and/or results in an increase in the $C_{dl}$ will be useful in electrochemical cells described herein. Furthermore, it is contemplated that the nanostructured material deposited on the first electrode can be the same as or different from the nanostructured material deposited at the second electrode.

In an aspect, a thermo-electrochemical cell comprises an electrochemical cell described herein. In another embodiment, a thermo-capacitive cell comprises an electrochemical cell described herein. In yet another embodiment, a thermo-electric device comprises an electrochemical cell described herein. In some cases, an electrochemical cell described herein can function as a thermoelectric generator which can produce power in the presence of a temperature gradient across the junctions of the cell.

In some embodiments, the electrochemical cell can be used as a supercapacitor which charges by temperature difference across the junctions. Furthermore, the electrochemical cell can also be used in some cases as a thermoelectric generator which produces power in existence of a temperature gradient across the junctions.

Furthermore, the thermoelectric device containing an electrochemical cell described herein has many applications in the conversion of low grade waste heat, for example in cell phone and electric vehicle batteries, isotope thermoelectric generators and power generators for wearable electronics. Waste thermal energy is abundant in industrial waste streams, and geothermal activities, all of which may be utilized by the device of the invention.

Conventional Radioisotope Thermoelectric Generators (RTGs) are used in space exploration and the most common materials used consist of plutonium and solid state thermocouples that convert the plutonium's decay heat energy to electricity. The materials currently employed in conventional RTGs are bulky and heavy in weight compared to the present invention. The density of ionic liquid is less than 20% of the weight of solid thermoelectric materials, thereby resulting in lighter devices. In some embodiments, electrochemical cells described herein can be useful in electric cars or isotope thermoelectric generators to decrease their weight and increase their usefulness. The weight of thermoelectric devices having electrochemical cells described herein compared to conventional thermoelectric materials with the same volume can be 3-5 times smaller, making them an exceptional candidate for automotive or space industries like Radioisotope thermoelectric generator (RTG).

Methods of preparing an electrochemical cell are also contemplated herein. In some embodiments, a method of preparing an electrochemical cell comprise providing a first electrode and a second electrode, depositing a layer of a nanostructured material on an inner surface of one or both of the first electrode and the second electrode, and positioning or disposing an ionic liquid between the inner surfaces of the first electrode and the second electrode. In some embodiments, a method comprises depositing a first nanostructured material on an inner surface of the first electrode. In other embodiments, a method comprises depositing a second nanostructured material on an inner surface of the second electrode. In yet other embodiments, a method comprises depositing a first nanostructured material on an inner surface of the first electrode and depositing a second nanostructured material on an inner surface of the second electrode. In some cases, the depositing steps is performed through electrodeposition. As previously discussed, the first nanostructured material can be the same or different from the second nanostructured material.

Methods described herein can further comprise adding, dispersing, or mixing nanoparticles into the ionic liquid. The nanoparticles can be of the same type or class of nanoparticles, or can be a mixture of different types or classes of nanoparticles, the nanoparticles being any nanoparticles described herein.

Some embodiments described herein are further illustrated in the following non-limiting examples.

Example 1

Deposition of Manganese Dioxide ($MnO_2$) Nanostructured Material on an Electrode A layer of $MnO_2$ was deposited on a steel electrode using electrophoretic deposition following a procedure described by Santhana Gopalan et al, "Scalable High-Power Redox Capacitors With Aligned Nanoforests Of Crystalline $MnO_2$ Nanorods By High Voltage Electrophoretic Deposition," ACS Nano, Vol. 7, No. 3, 2114-2125 (2013), the entirety of which is incorporated by reference herein.

Stable dispersions of $\alpha$-$MnO_2$ nanorods (0.01 mg/mL) in isopropyl alcohol (IPA) were prepared by sonicating their mixture for 20 min using a probe sonicator (Sonics and Materials Inc., Connecticut). Precursor salts, $Mg(NO_3)_2$-$6H_2O$ (0.005 mg/mL) and $NiCl_2$-$6H_2O$ (0.0075 mg/mL) (Fisher Scientific, Pa.), were then added to their respective R—MnO2 nanorod dispersions and sonicated for an additional 15 min. The concentrations of the nanorods were determined from control experiments to maximize deposition density while avoiding bundle formation during high voltage electrodeposition (HVEPD). The salt concentrations were chosen as the minimal value that the nanorods can receive sufficient positive charges and a uniform holding layer can be formed by the electroplating co-occurring with HVEPD. The dispersions were found stable for at least a couple of weeks. Small, rigid stainless steel (SS) electrodes (McMaster, Ill.) with an exposed area of 2.00×2.54 $cm^2$ were used in the electrophoretic cell with an electrode gap of 10 mm controlled by a spacer. Care was taken to ensure that the electrodes were parallel to each other. A high voltage power source (Stanford Research Systems, Calif.) provided the high voltages needed for HVEPD. The weight of the deposit was measured using a micro balance (Adam Equipment Inc., Connecticut) as 0.08 mg/$cm^2$. About 10 samples were measured to obtain an accurate average value for the weight of the deposit. HVEPD for the $\alpha$-$MnO_2$ nanorods with the Ni holding layer was also conducted on pretreated stainless steel substrates to further reduce contact resistance. A standard Wood's strike was used as pretreatment of the SS substrate to remove its oxide layer and coat a thin layer of nickel. Wood's strike was conducted on the SS electrodes with a nickel counter electrode. The two electrodes were placed in parallel and kept 10 mm away from each other in an electrochemical cell. A current density of around 200 A/$m^2$ was then applied in the wood's strike solution with 240 g/L of $NiCl_2$-$6H_2O$ and 125 mL/L of HCL to electrodeposit $MnO_2$ on the surface of the electrode.

Example 2

Deposition of ACT-$MnO_2$ Nanostructured Material on an Electrode

A layer of ACNT–$MnO_2$ was deposited on a steel electrode using electrophoretic deposition following a procedure described in Example 1, where the $MnO_2$ material was substituted with ACNT–$MnO_2$.

Example 3

Device for Measuring Seebeck Voltage in an Electrochemical Cell

Figure 3:
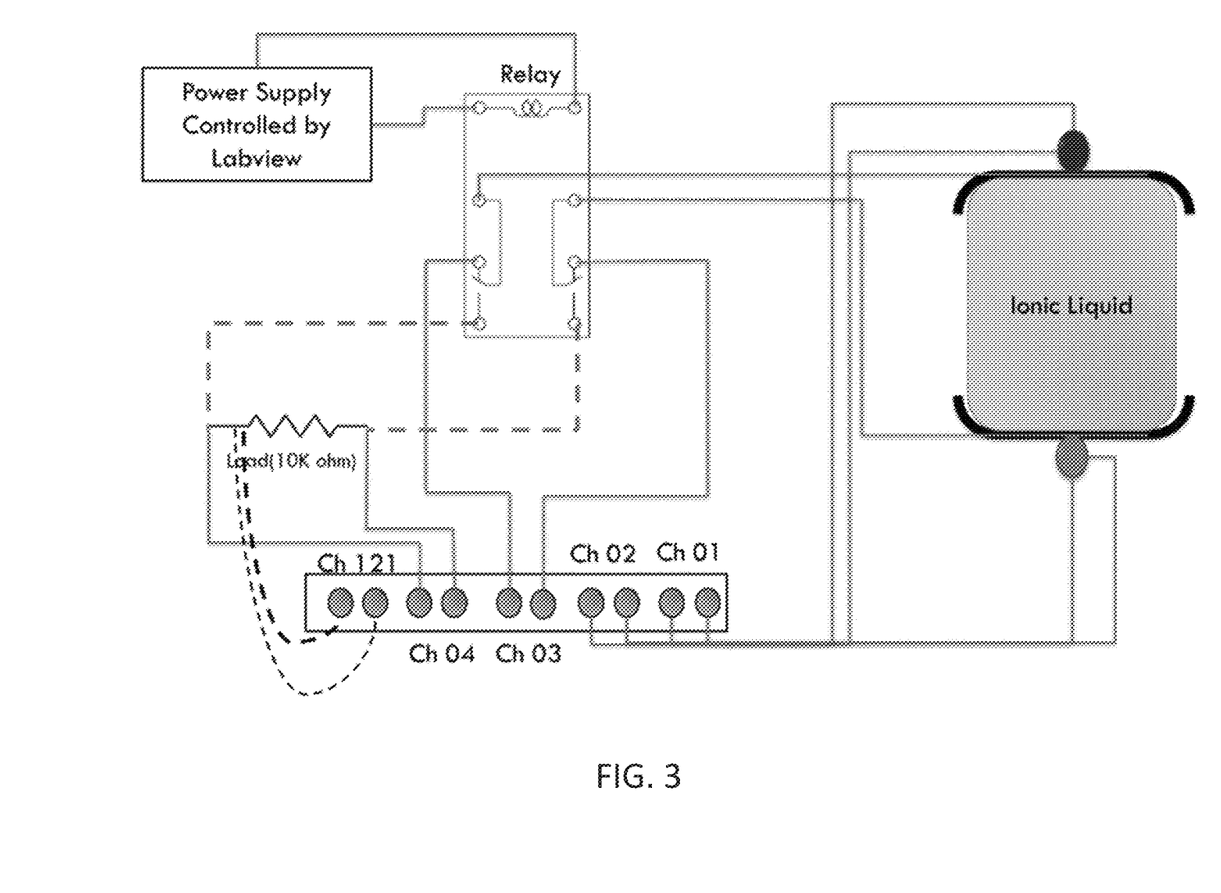
FIG. 3 is a schematic of a device for measuring discharge and the Seebeck coefficient (S or $\alpha$) of electrochemical cells described herein.

FIG. 3 shows a schematic of device for measuring Seebeck voltage in electrochemical cells described herein. As shown, to measure Seebeck voltage, Channels 1, 2, and 3 are open. Channel 1 measures T1, which is the temperature at the hot junction. Channel 2 measures T2, which is the temperature at the cold junction. Channel 3 measures open voltage for the cell. The Seebeck voltage can be measured according to known methods using the described device.

To measure discharge of the electrochemical cell, Channel 1 again measures T1, and Channel 2 again measures T2. Channel 3 is closed. Channel 4 measures voltage (load). Channel 21 measures current (load). Discharge can be measured according to known methods using the described device.

Example 4

Seebeck Voltage of Thermoelectric Device with Steel Electrodes

Figure 4:
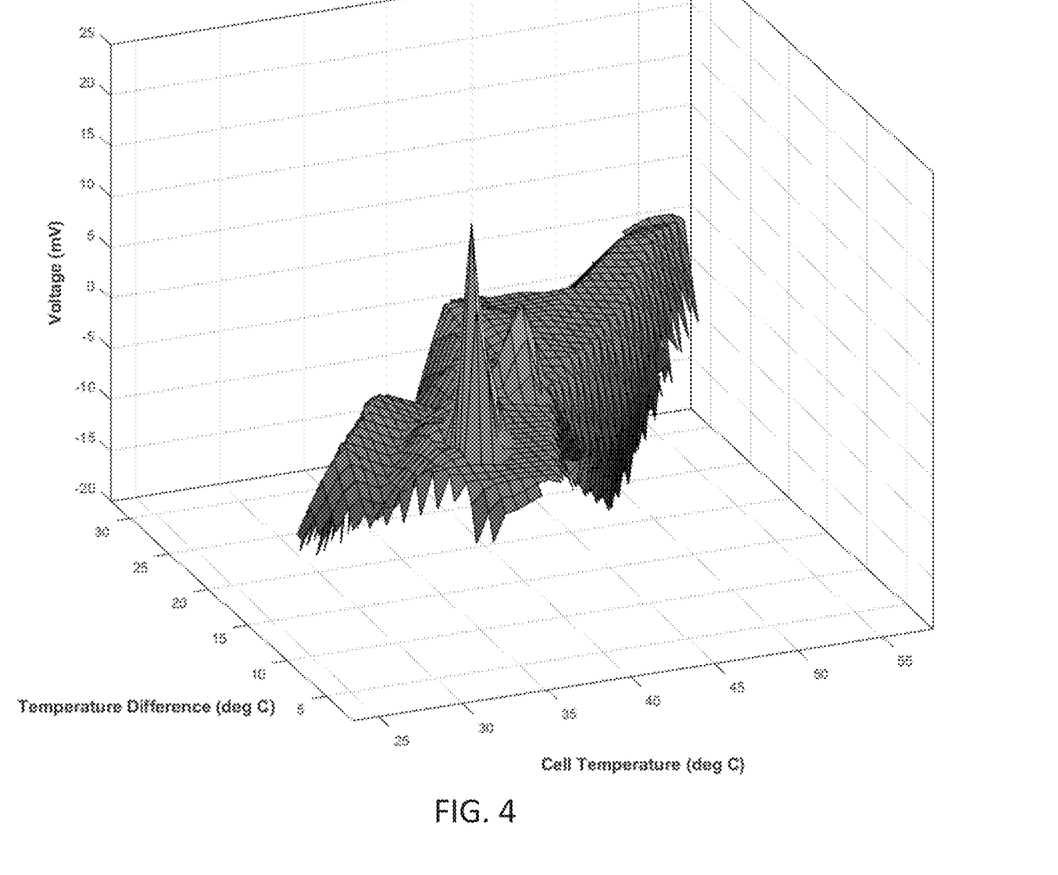
FIG. 4 is graph showing voltage measurements of a thermoelectric device having an electrochemical cell with uncoated steel electrodes.

A control device was constructed according to Example 3 using an electrochemical cell having first and second steel electrodes without any nanostructured materials on either inner surface. The Seebeck voltage of the electrochemical cell was then measured at different temperature gradients. FIG. 4 shows voltage measurements (in millivolts) based on average cell temperature ((T1+T2)/2) and the thermal difference between the hot junction and the cold junction (T1−T2). FIG. 4 illustrates a baseline Seebeck voltage measurements at different thermal gradients for an electrochemical cell having bare steel electrodes.

Example 5

Figure 5:
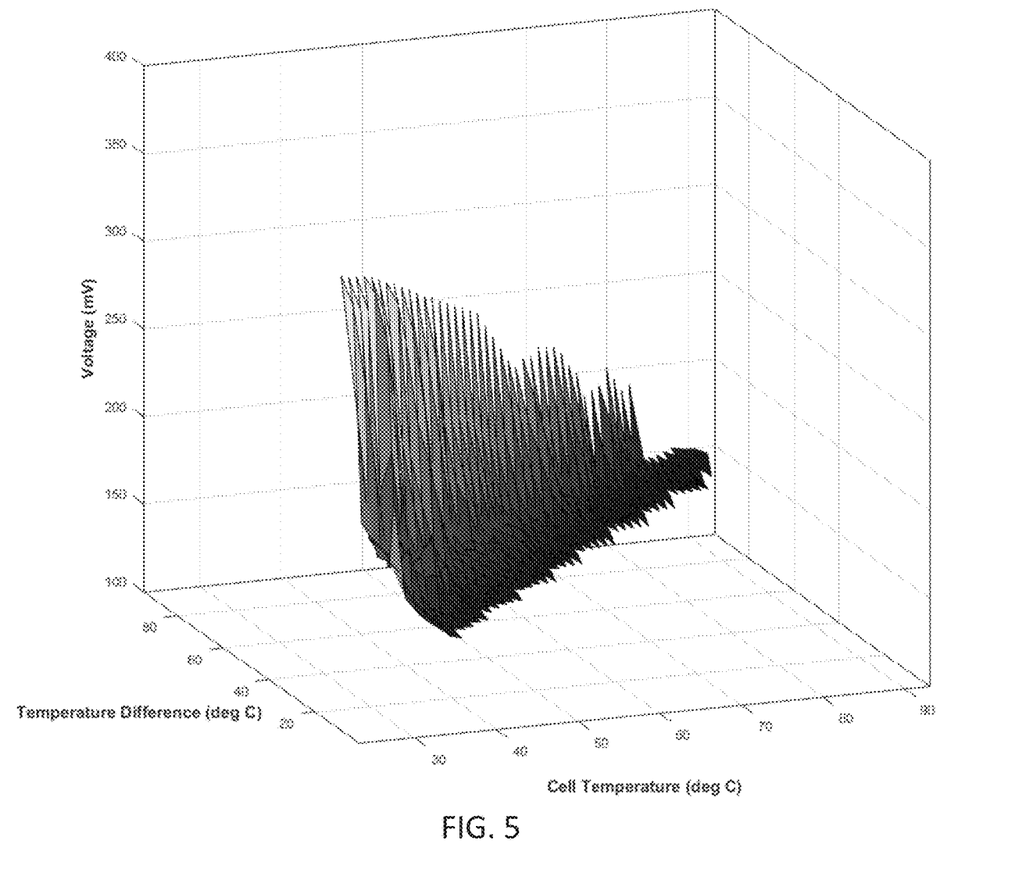
FIG. 5 is a graph showing voltage measurements of a thermoelectric device having an electrochemical cell with steel electrodes having a $MnO_2$ nanostructure deposited on an inner surface.

Seebeck Voltage of Thermoelectric Device with Steel Electrodes Having $MnO_2$ Layer An electrochemical cell was assembled using a steel first electrode having a $MnO_2$ nanostructured material deposited on an inner surface, the first electrode being prepared according to Example 1. A second electrode having a $MnO_2$ nanostructured material deposited on an inner surface was also prepared according to Example 1. A device was then constructed according to Example 3 using an electrochemical cell using the first electrode and the second electrode. Thus, both inner surfaces of the first electrode and the second electrode had a layer of $MnO_2$. 1-ethyl-3-methyl-imidazolium triflate was used as the ionic liquid. The Seebeck voltage of the electrochemical cell was then measured at different temperature gradients using known methods. FIG. 5 shows voltage measurements (in millivolts) based on average cell temperature ((T1+T2)/2) and the thermal difference between the hot junction and the cold junction (T1−T2). As shown in FIG. 5, the Seebeck voltage increased across all temperatures using a electrochemical cell with $MnO_2$ deposited on the inner surfaces of the first and second electrodes, as compared to the electrochemical cell with uncoated steel electrodes described in Example 4.

Additionally, the Seebeck voltage was observed to vary as a function of temperature when using $MnO_2$ layered electrodes. While not intending to be bound by theory, this variation is believed to be caused by the electrochemistry at the interface of the ionic liquid and the electrode. As previously discussed, for ionic liquids, charge is transferred by ions rather than electrons like traditional materials. Thus, the interaction of the large cation and small anion of the ionic liquid with the surface of the electrode is a major contributing factor in the charge mechanism and physical properties of the electrochemical cell. Here, for $MnO_2$-coated electrodes, the effect of this interaction is pseudocapacitive charging rather than electrical double layer (EDL) charging. Thus, electrochemical cells with $MnO_2$ coated electrodes are sensitive to the hot/cold junction temperatures. Finally, the large increase in the Seebeck voltage over that of the bare steel electrodes also suggests that the increased surface area of the electrode is also a contributing factor.

Example 6

Figure 6:
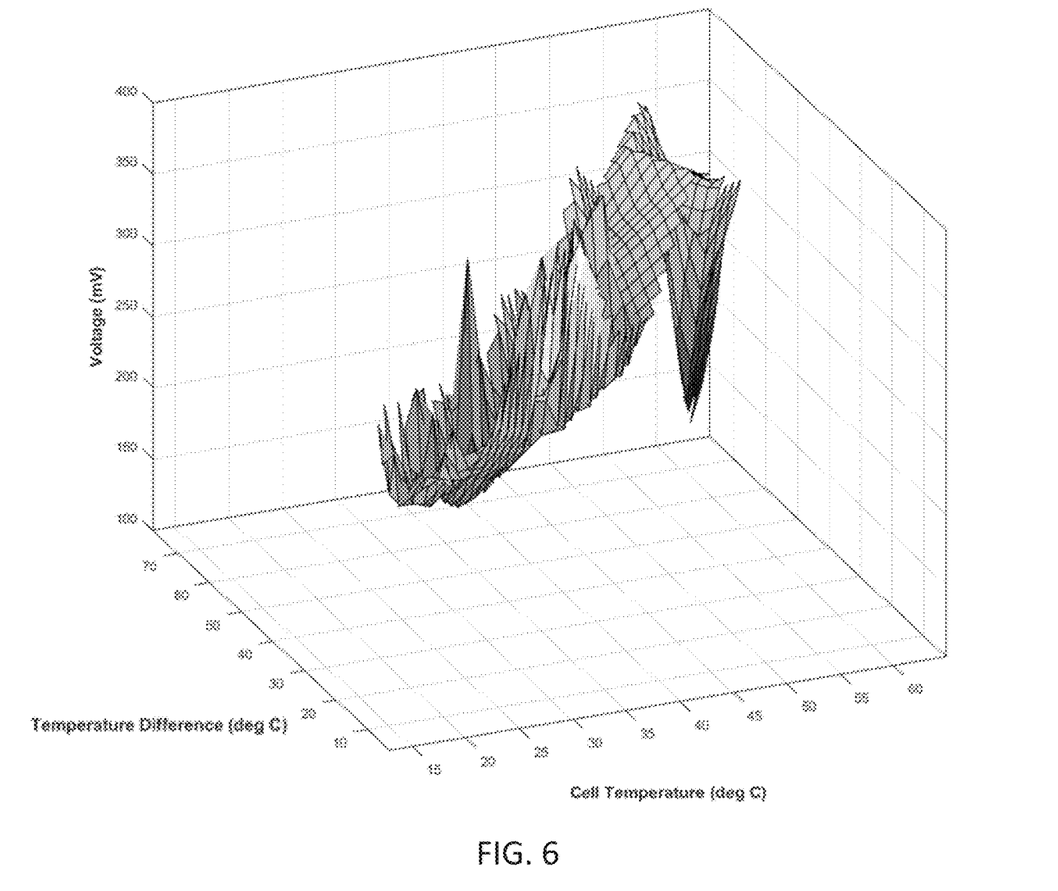
FIG. 6 is a graph showing voltage measurements of a thermoelectric device having an electrochemical cell with steel electrodes having Aligned CNT+$MnO_2$ deposited on the inner surface.

Discharge Voltage of Thermoelectric Device with Steel Electrodes Having ACNT $MnO_2$ Layer An electrochemical cell was assembled using a steel first electrode having an ACNT+$MnO_2$ nanostructured material deposited on an inner surface, the first electrode being prepared according to Example 2. A second electrode having an ACNT+$MnO_2$ nanostructured material deposited on an inner surface was also prepared according to Example 2. A device was then constructed according to Example 3 using an electrochemical cell having first and second steel electrodes prepared according to Example 2. Thus, both inner surfaces of the first electrode and the second electrode had a layer of ACNT+$MnO_2$. 1-ethyl-3-methylimidazolium triflate was used as the ionic liquid. The Seebeck voltage of the electrochemical cell was then measured at different temperature gradients. FIG. 6 shows voltage measurements (in millivolts) based on average cell temperature ((T1+T2)/2) and the thermal difference between the hot junction and the cold junction (T1−T2).

As shown in FIG. 6, the Seebeck voltage increased across all temperatures using a electrochemical cell with ACNT+$MnO_2$ deposited on the inner surfaces of the first and second electrodes, as compared to the electrochemical cell with uncoated steel electrodes described in Example 4. Moreover, in contrast to the Seebeck voltage observed for the $MnO_2$ layered electrodes, the Seebeck voltage was observed to be relatively constant with regards to temperature differences between the hot/cold junctions. While not intending to be bound by theory, this temperature insensitivity at the hot/cold junctions suggests that the electrochemistry at the interface of the ionic liquid and the electrode is different for the ACNT+$MnO_2$ layered electrodes than it is for the $MnO_2$ layered electrodes, and likely indicates mostly electrical double layer (EDL) charging for the ACNT+$MnO_2$ layered electrodes rather than the pseudocapacitive charging observed for the $MnO_2$ layered electrodes.

What is claimed is:

1. An electrochemical cell, comprising:
   a first electrode having a first inner surface;
   a second electrode having a second inner surface, the second inner surface facing the first inner surface;
   a separate nanostructured material positioned on at least one of the first inner surface and second inner surface; and
   an ionic liquid positioned between the first inner surface and the second inner surface, the ionic liquid being in electrical communication with the first electrode and second electrode, and the ionic liquid being in electrical communication with the nanostructured material, wherein charge is stored at the first and second electrodes in response to a thermal gradient applied to the electrochemical cell, wherein the thermal gradient is applied at least in part across the ionic liquid, wherein the ionic liquid comprises anions and cations which form at least an electric screening layer over the nanostructured material.

2. The electrochemical cell of claim 1, wherein the nanostructured material is a first nanostructured material positioned on the first inner surface.

3. The electrochemical cell of claim 1, wherein the nanostructured material is a second nanostructured material positioned on the second inner surface.

4. The electrochemical cell of claim 1, wherein the nanostructured material comprises:
   a first nanostructured material positioned on the first inner surface; and
   a second nanostructured material positioned on the second inner surface.

5. The electrochemical cell of claim 4, wherein the first nanostructured material and the second nanostructured material comprise the same nanostructured material.

6. The electrochemical cell of claim 4, wherein the first nanostructured material is a different nanostructured material than the second nanostructured material.

7. The electrochemical cell of claim 1, wherein the first electrode and second electrode comprise electrically conductive plates.

8. The electrochemical cell of claim 1, wherein the nanostructured material has an average size in one dimension of between about 8 nm and about 12 μm.

9. The electrochemical cell of claim 8, wherein the nanostructured material comprises carbon nanotubes (CNT) having an average size in one dimension of between about 10 nm and about 10 μm.

10. The electrochemical cell of claim 8, wherein the nanostructured material comprises $MnO_2$ having an average size in one dimension of between about 10 nm and about 10 μm.

11. The electrochemical cell of claim 8, wherein the nanostructured material comprises $CNT-MnO_2$ having an average size in one dimension of between about 10 nm and about 10 μm.

12. The electrochemical cell of claim 1, wherein the ionic liquid is an imidazolium-based ionic liquid.

13. The electrochemical cell of claim 12, wherein the imidazolium-based ionic liquid comprises ethyl-3 methylimidazolium triflate, ethyl-3 methylimidazolium tetrafluroborate, ethyl-3 methylimidazolium bis(trifluoromethylsulfonyl)imide, or any combination thereof.

14. The electrochemical cell of claim 1, wherein the ionic liquid further comprises a nanoparticle dispersion.

15. The electrochemical cell of claim 14, wherein the nanoparticle dispersion comprises a multi-wall carbon nanotube, a semiconductor, a metal, a synthetic polymer, or any combination thereof.

16. The electrochemical cell of claim 1, having a figure of merit (ZT) of at least 2 at all operating temperatures.

17. The electrochemical cell of claim 14, wherein the nanoparticles in the nanopartide dispersion increases electrical conductivity ($\sigma$) of the ionic liquid, and increases a figure of merit (ZT) value of the electrochemical cell compared to an electrochemical cell without a nanoparticle dispersion.

18. A thermo-electrochemical cell comprising the electrochemical cell of claim 1.

19. A thermocapacitive cell comprising the electrochemical cell of claim 1.

20. A thermoelectric device comprising the electrochemical cell of claim 1.

* * * * *

UNITED STATES PATENT AND TRADEMARK OFFICE
CERTIFICATE OF CORRECTION

| | | |
|---|---|---|
| PATENT NO. | : 11,716,905 B2 | Page 1 of 1 |
| APPLICATION NO. | : 16/449838 | |
| DATED | : August 1, 2023 | |
| INVENTOR(S) | : Hyejin Moon et al. | |

It is certified that error appears in the above-identified patent and that said Letters Patent is hereby corrected as shown below:

In the Claims

Column 16, Line 20: Delete "nanopartide"; and insert --nanoparticle--.

Signed and Sealed this
Twenty-eighth Day of November, 2023

*Katherine Kelly Vidal*

Katherine Kelly Vidal
*Director of the United States Patent and Trademark Office*